(12) United States Patent
Kim et al.

(10) Patent No.: US 9,867,296 B2
(45) Date of Patent: Jan. 9, 2018

(54) PRINTED CIRCUIT BOARD AND PACKAGE SUBSTRATE

(71) Applicant: LG INNOTEK CO., LTD., Seoul (KR)

(72) Inventors: Dong Sun Kim, Seoul (KR); Sung Wuk Ryu, Seoul (KR); Hyun Seok Seo, Seoul (KR); Ji Haeng Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 200 days.

(21) Appl. No.: 14/753,087

(22) Filed: Jun. 29, 2015

(65) Prior Publication Data

US 2015/0382463 A1 Dec. 31, 2015

(30) Foreign Application Priority Data

Jun. 30, 2014 (KR) ................ 10-2014-0080822

(51) Int. Cl.
| | |
|---|---|
| *H05K 7/10* | (2006.01) |
| *H05K 7/12* | (2006.01) |
| *H05K 3/40* | (2006.01) |
| *H01L 23/498* | (2006.01) |
| *H01L 25/10* | (2006.01) |

(Continued)

(52) U.S. Cl.
CPC ..... *H05K 3/4007* (2013.01); *H01L 23/49822* (2013.01); *H01L 25/105* (2013.01); *H01L 25/50* (2013.01); *H01L 24/13* (2013.01); *H01L 24/16* (2013.01); *H01L 24/81* (2013.01); *H01L 2224/131* (2013.01); *H01L 2224/16227* (2013.01); *H01L 2224/81192* (2013.01); *H01L 2225/1023* (2013.01); *H01L 2225/1058* (2013.01); *H01L 2924/1434* (2013.01); *H01L 2924/15311* (2013.01); *H01L 2924/15331* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H05K 1/144* (2013.01); *H05K 2201/0367* (2013.01); *H05K 2201/042* (2013.01); *H05K 2203/1383* (2013.01)

(58) Field of Classification Search
CPC ..... H01L 25/105; H01L 21/563; H05K 1/118; H05K 1/181; H05K 1/189
USPC .................. 361/770–795; 257/686–730
See application file for complete search history.

(56) References Cited

U.S. PATENT DOCUMENTS

| | | | | |
|---|---|---|---|---|
| 7,928,557 B2* | 4/2011 | Oi | ........... | H01L 25/105 |
| | | | | 257/686 |
| 8,004,074 B2* | 8/2011 | Mori | ........... | H01L 21/4853 |
| | | | | 257/686 |

(Continued)

FOREIGN PATENT DOCUMENTS

| | | |
|---|---|---|
| KR | 10-2011-0035176 A | 4/2011 |
| KR | 10-1095179 B1 | 12/2011 |
| KR | 10-2013-0132173 A | 12/2013 |

*Primary Examiner* — Tuan T Dinh
(74) *Attorney, Agent, or Firm* — LRK Patent Law Firm

(57) ABSTRACT

A printed circuit board includes an insulating substrate, a plurality of pads on a top surface of the insulating substrate, a protective layer formed on the insulating substrate and having an opening to expose top surfaces of the pads, a bump formed on at least one of the pads and protruding upward of a surface of the protective layer. The bump has a curved lateral side.

6 Claims, 12 Drawing Sheets

(51) Int. Cl.
*H01L 25/00* (2006.01)
*H05K 1/14* (2006.01)
*H01L 23/00* (2006.01)

(56) References Cited

U.S. PATENT DOCUMENTS

| 2005/0263869 A1* | 12/2005 | Tanaka | H01L 21/563 |
| | | | 257/686 |
| 2010/0155920 A1* | 6/2010 | Lee | H01L 25/105 |
| | | | 257/686 |
| 2015/0130060 A1 | 5/2015 | Ryu et al. | |

* cited by examiner

PRINTED CIRCUIT BOARD AND PACKAGE SUBSTRATE

CROSS-REFERENCE TO RELATED APPLICATIONS

The present application claims priority under 35 U.S.C. §119 to Korean Patent Application No. 10-2014-0080822, filed Jun. 30, 2014, which is hereby incorporated by reference in its entirety.

BACKGROUND

1. Field of the Invention

The embodiment relates to a printed circuit board, a package substrate, and a method of fabricating the same.

2. Description of Related Art

In general, the package substrate has a structure in which a first substrate having a memory chip attached thereto is integrated with a second substrate having a processor chip attached thereto.

The package substrate has advantages in that the mounting area of the chips can be reduced, and a signal can be transmitted at a high rate as the processor chip and the memory chip are integrated in one package.

The package substrate has been extensively applied to various mobile appliances due to the advantages.

FIG. 1 is a sectional view showing a package substrate according to the related art.

Referring to FIG. 1, the package substrate includes a first substrate 20 and a second substrate 30 attached onto the first substrate 20.

In addition, the first substrate 20 includes a first insulating layer 1, a circuit pattern 2 formed on at least one surface of the first insulating layer 1, a second insulating layer 2 formed on the first insulating layer 1, a third insulating layer 3 formed under the first insulating layer 1, a circuit pattern 4 formed on at least one surface of the first insulating layer 1, a conductive via 5 formed in at least one of the second insulating layer 2 and the third insulating layer 3, a pad 6 formed on a top surface of the second insulating layer 2, a plurality of bonding pastes 7 formed on the pad 6, a memory chip 8 formed on at least one of the bonding pastes 7, a first protective layer 10 formed on the second insulating layer 2 to expose a portion of a top surface of the pad 6 and a second protective layer 9 formed on the protective layer 10 to cover the memory chip 8.

In addition, the second substrate 30 includes a fourth insulating layer 11, a circuit pattern 12 formed on at least one surface of the fourth insulating layer 11, a pad 13 formed on at least one surface of the fourth insulating layer 11, a conductive via 14 formed in at least one surface of the fourth insulating layer 11, a processor chip 15 formed on the fourth insulating layer 11, and a connection member S to connect the processor chip 15 with the pad 13.

FIG. 1 is a schematic view showing a package on package (PoP) employing a through mold via (TMV) technology based on a laser technology.

According to the TMV technology, after molding the first substrate, a conductive via to be connected with the pad is formed through a laser process, so that a solder ball (bonding paste) is printed in the conductive via.

In addition, the second substrate 30 is attached to the first substrate 20 by the printed solder ball 7.

However, the related art has a limitation in forming a fine pitch since the first substrate is connected with the second substrate using the solder ball 7.

In addition, according to the related art, since the solder ball 7 is used, issues such as a solder crack, a solder bridge, and a solder collapse, may be occur.

SUMMARY

The embodiment provides a printed circuit board having a novel structure.

The embodiment provides a printed circuit board in which a fine pitch can be easily formed.

The above objects and other objects, which are not mentioned above, can be apparently comprehended by those skilled in the art based on the following disclosure.

According to the embodiment, there is provided a printed circuit board including an insulating substrate, a plurality of pads on a top surface of the insulating substrate, a protective layer formed on the insulating substrate and having an opening to expose top surfaces of the pads, a bump formed on at least one of the pads and protruding upward of a surface of the protective layer. The bump has a curved lateral side.

In addition, the bump has an upper width and a lower width which are different from each other.

Further, the bump a lower width and an upper width narrower than the lower width.

In addition, the printed circuit board further includes a seed layer between the at least one pad and the bump.

In addition, the bump is formed by wet-etching a metallic pate formed using the seed layer.

Further, the printed circuit board further includes an electronic device attached to at least one of remaining pads by a bonding ball formed on the at least one of the remaining pads. The electronic device is formed at an upper portion of the insulating substrate and exposed to an outside.

In addition, the bump has a top surface higher than a top surface of the electronic device attached to the upper portion of the insulating substrate.

In addition, the bump has a width gradually decreased from an upper portion of the bump toward a central portion of the bump, and gradually increased from the central portion to a lower portion of the bump.

According to the embodiment, there is provided a package substrate including a lower substrate having at least one electronic device or at least one first chip attached thereto, and an upper substrate having at least one second chip attached thereto and coupled to the lower substrate. The lower substrate includes an insulating substrate, and a plurality of bumps provided on the insulating substrate, protruding upward of a surface of the insulating substrate, formed on a top surface thereof with a solder ball, and having a curved lateral side. The upper substrate is supported by the bumps and attached to the lower substrate through the solder ball.

The at least one electronic device or the at least first chip is formed at an upper area of the insulating substrate between the bumps to be exposed to an outside, and has a top surface provided lower than the top surface of the bumps.

In addition, the bumps have a lower width and an upper width narrower than the lower width.

In addition, the bumps include a seed layer between the insulating substrate and the bumps.

Further, the bumps have a width gradually decreased from an upper portion of the bumps toward a central portion of the bumps, and gradually increased from the central portion to a lower portion of the bumps.

In addition, according to the embodiment, there is provided a method of fabricating a package substrate. The method includes preparing a first insulating substrate, forming a plurality of pads on the first insulating substrate, forming a protective layer, which has an opening to expose a top surface of the pads, on the first insulating substrate, forming a seed layer on a top surface and a lateral side of the protective layer and the top surface of the pads exposed through the opening, forming a metallic plate on the seed layer using the seed layer, forming a mask on a top surface of the metallic plate vertically overlapped with the top surface of the pads, forming a plurality of bumps by wet-etching the metallic plate, removing the mask, and etching the seed layer.

In addition, the bumps have a lateral side that is curved by the wet-etching.

In addition, the bumps have a lower width and an upper width narrower than the lower width.

Further, the etching of the seed layer is performed except for a portion of the seed layer provided under the bumps.

In addition, the bumps have a width gradually decreased from an upper portion of the bumps toward a central portion of the bumps, and gradually increased from the central portion to a lower portion of the bumps.

In addition, the method further includes attaching at least one of an electronic device and a chip to at least one of the pads formed on the first insulating substrate and interposed between the bumps, forming a bonding ball on the bumps, fabricating at least one upper substrate, and attaching the upper substrate to the bumps by providing the upper substrate on the bonding ball.

Further, the method further includes attaching at least one of the electronic device and the chip onto at least one of pads formed on the first insulating substrates and positioned between the bumps, and top surfaces of the electronic device and the chip are lower than the top surface of the pads.

In addition, the method further includes forming a molding layer between the first insulating substrate and the upper substrate such that the bumps and the at least one of the electronic device and the chip is buried in the molding layer.

As described above, according to the embodiment, the bump is formed on the lower substrate, and the upper substrate is attached to the lower substrate using the bump, thereby fabricating the package substrate, so that the fine pitch can be formed. Accordingly, the productivity of a manufacturer can be maximized.

In addition, according to the embodiment, the electronic device exposed to the outside is attached on the lower substrate and the attachment space of the electronic device is molded using resin in the package process performed together with the upper substrate. Accordingly, the degree of freedom can be enhanced in the design of the substrate for the attachment of the electronic device, and the productivity can be improved in terms of product yield.

In addition, according to the embodiment, since the molding area formed between the lower substrate and the upper substrate is supported by the metal post formed on the lower substrate, the electronic device attached to the molding area can be efficiently protected, so that the reliability of the package substrate can be improved.

Further, according to the embodiment, the lateral side of the metal post is curved and the metal post has the shape of a trapezoid having the upper width narrower than the lower width, so that the distance between adjacent metal posts is increased to prevent the short failure. In addition, the upper substrate can be attached to the lower substrate using a small amount of solder.

In addition, according to the embodiment, since the metal post is formed through an etch scheme instead of a pattern plating scheme, the fabrication cost of the printed circuit board can be reduced.

The details of one or more embodiments are set forth in the accompanying drawings and the description below. Other features will be apparent from the description and drawings, and from the claims.

DETAILED DESCRIPTION OF THE EMBODIMENTS

Figure 1:
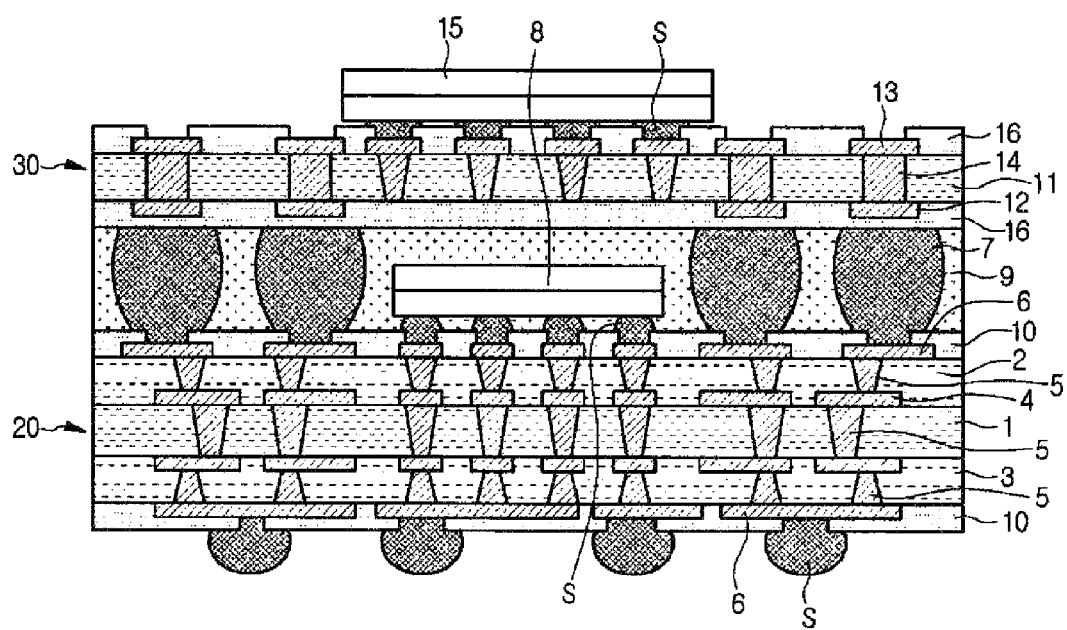
FIG. 1 is a sectional view showing a package substrate according to the related art.

Hereinafter, embodiments will be described in detail with reference to accompanying drawings so that those skilled in the art can easily work with the embodiments. However, the embodiments may have various modifications.

In the following description, when a predetermined part "includes" a predetermined component, the predetermined part does not exclude other components, but may further include other components unless indicated otherwise.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer (or film), a region, or a plate is referred to as being "on" another part, it can be "directly" or "indirectly" over the other part, or one or more intervening layers may also be present. On the contrary, it will be understood that, when a certain part is referred to as being "directly on" another part, one or more intervening layers may be absent.

Figure 2:
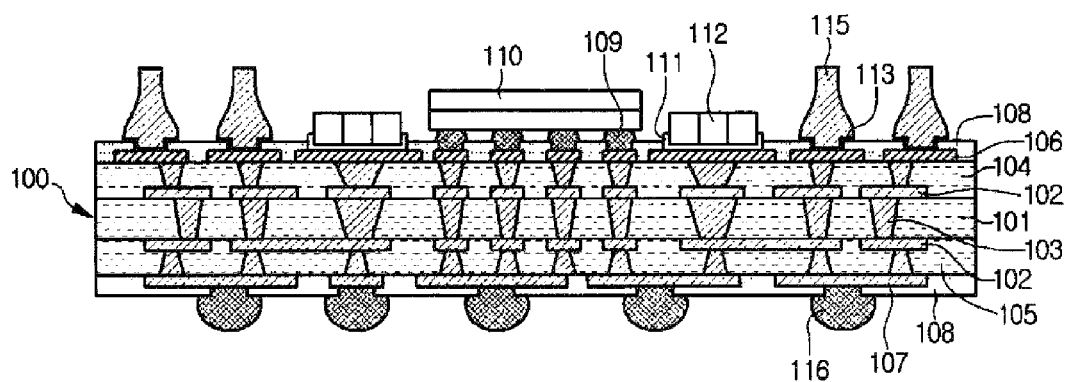
FIG. 2 is a sectional view showing a printed circuit board according to the embodiment.

FIG. 2 is a sectional view showing a printed circuit board according to the embodiment.

Referring to FIG. 2, the printed circuit board according to the embodiment includes a first insulating layer 101, a circuit pattern 102, a conductive via 103, a second insulating layer 104, a third insulating layer 105, a first pad 106, a second pad 107, a protective layer 108, a first solder ball 109, a processor chip 110, an electronic device 112, a bonding paste 111, a second solder ball 116, a seed layer 113, and a bump 115.

The first insulating layer 101 may be a core substrate.

Although the first insulating layer 101 may be a support substrate of the printed circuit board having a single circuit pattern, the first insulating layer 101 may refer to an area in which any one circuit pattern is formed in a substrate having a plurality of lamination structures.

The second insulating layer 104 is formed on the first insulating layer 101, and the third insulating layer 105 is formed under the first insulating layer 101.

The first, second, and third insulating layers 101, 104, and 105 may be provided in the form of an insulating plate, and may include a thermosetting or thermoplastic polymeric substrate, a ceramic substrate, an organic-inorganic composite material substrate, or a glass fiber impregnated substrate. If the insulating layers include the polymeric resin, the insulating layers may include epoxy insulating resin, such as FR-4, bismaleimide triazine (BT), or ajinomoto build up film (ABF). Alternatively, the insulating layers may include polyimide based resin, but the embodiment is not limited thereto.

The first to third insulating layers 101, 104, and 105 may be formed different materials. For example, the first insulating layer 101 may be a glass fiber impregnated substrate, and the second and third insulating layers 104 and 105 may include an insulating sheet formed of only resin.

The first insulating layer 101 may be a center insulating layer and may have a thickness thicker than those of the second and third insulating layers 104 and 105.

The circuit pattern 102 is formed in at least one of a top surface and a bottom surface of the first insulating layers 101.

The circuit pattern 102 may be formed through typical processes, such as an additive process, a subtractive process, a modified semi-additive process (MSAP), and a semi-additive process, of fabricating the printed circuit board, and the details thereof will be omitted.

In addition, the first insulating layer 101 is formed therein with the conductive via 103 to connect circuit patterns, which are formed in mutually different layers, with each other.

External circuit patterns (not shown) are formed in both of the second insulating layer 104 formed on the first insulating layer 101 and the third insulating layer 105 formed under the first insulating layer 101.

The external circuit patterns (not shown) are formed on exposed surfaces of the second insulating layer 104 formed on the first insulating layer 101 and the third insulating layer 105 formed under the first insulating layer 101. In this case, the external circuit patterns may be a first pad 106 and a second pad 107. In detail, the external circuit patterns may be classified into a pad and a circuit pattern according to use purposes.

In, other words, the external circuit patterns may refer to the first and second pads 106 and 107 shown in drawings. In addition, the external circuit patterns may be formed through the same processes as those of the pads 106 and 107, and may be classified into a pattern and a pad according to the functions thereof.

In other words, circuit patterns are formed on the surfaces of the second insulating layer 104 and the third insulating layer 105. A portion of the circuit patterns may be an external circuit pattern and the remaining circuit patterns may be the first and second pads 1'06 and 107 connected with a chip or another substrate according to the functions of the circuit patterns.

In addition, the second and third insulating layers 104 and 105 are formed therein with conductive vias 103.

The conductive vias 103 may be formed by forming a via hole to open at least one of the first, second, and third insulating layers 101, 104, and 105 through a laser process and filling metallic paste in the via hole.

In this case, the conductive vias 103 may be formed of any one metallic material selected from the group consisting of Cu, Ag, Sn, Au, Ni and Pd. The filling of the metallic material may be performed through any one of an electroless plating scheme, an electrolytic plating scheme, a screen printing scheme, a sputtering scheme, an evaporation scheme, an injecting scheme, and a dispensing scheme or the combination thereof.

Meanwhile, the via hole may be formed through any one of a machining process, a laser process, and a chemical process.

A milling process, a drill process, and a routing process may be used when the via hole is formed through the machining process, a UV laser scheme or a Co2 laser scheme may be used when the via hole is formed through the laser process, and chemicals including aminosilane or ketones may be used when the via hole is formed through the chemical process to open the first, second, and third insulating layers 101, 104, and 105.

Meanwhile, the laser process is a cutting scheme that concentrates optical energy onto a surface to melt and evaporate a portion of a material so that the material is formed in a desired shape. According to the laser process, even a complex shape can be easily processed in a computer program, and a composite material, which may be not cut through another scheme, can be processed.

In addition, the laser process allows a cutting diameter to be 0.005 mm or more, and has a wide processing thickness range.

Preferably, a YAG (Yttrium Aluminum Garnet) laser, a $CO_2$ laser, and an ultraviolet laser may be used for a laser process drill. However, the YAG laser can process both of a copper layer and an insulating layer, and the $CO_2$ laser can process only the insulating layer.

Protective layers 108 are formed on the surfaces (surfaces exposed to the outside, or surfaces having the pad) of the second and third insulating layers 104 and 105.

The protective layer 108 has an opening part to expose the top surface of the first pad 106.

In other words, the protective layers 108 protect the surfaces of the second and third insulating layers 104 and 105. The protective layers 108 are formed throughout the entire surfaces of the second and third insulating layers 104 and 105. The protective layers 108 have openings to open the top surfaces of the lamination structures of first pads 106.

The protective layer 108 may include at least one layer formed using at least one of solder resist, an oxide, and gold (Au).

The first pads 106 exposed through the openings of the protective layers 108 are classified into various pads.

In other words, the first pads 106 are classified into a pad connected with the processor chip 110 or the electronic device 112 and a pad connected with an external substrate.

Accordingly, the first solder ball 109 is formed on at least one of the first pads 106, and the processor chip 110 is attached to the first pad 106 through the first solder ball 109.

In addition, the bonding paste 111 is formed on at least one of remaining first pads 106, so that the electronic device 112 is attached to the first pad 106 through the bonding paste 111.

The electronic device 112 may be a passive device. For example, the electronic device 112 may be a resistor, an inductor, or a capacitor. Preferably, the electronic device 112 may be a multiple layer ceramic capacitor (MLCC).

The bonding paste 111 may include at least one solder cream selected from the group consisting of a low-melting-point solder, a high-melting-point solder, a solder including alloy particles, a resin-containing solder, and the combination thereof, or a metal material having an adhesive property.

If necessary, the bonding paste 111 may include metallic powders to ensure electric conductivity.

As the bonding paste 111 is applied on the at least one of the remaining first pads 106, the electronic device 112 is securely mounted on the bonding paste 111, so that the bonding paste 111 is deposited in a lateral side direction of the electronic device 112.

In addition, the second solder ball 116 is formed on the exposed surface of the second pad 107 formed on the surface of the third insulating layer 105.

As described above, according to the printed circuit board of the present invention, the electronic device 112 and the processor chip 110 are not buried in at least one of the first insulating layer 101, the second insulating layer 104, and the third insulating layer 105, but formed on the second insulating layer 104, so that the electronic device 112 and the processor chip 110 are exposed to the outside.

The electronic device 112 and the processor chip 110 are buried in a molding layer (to be described later) formed in a package process, which is performed later together with an upper substrate.

Meanwhile, the bump 115 is formed on at least one of the first pads 106.

The bump 115 is formed on a top surface of the first pad 106 exposed through the protective layer 108.

In addition, the bump 115 protrudes from the surface of the protective layer 108. The bump 115 may have the shape of a column having upper and lower widths different from each other.

Preferably, the bump 115 has a shape in which the upper width is narrower than the lower width. Further, the lateral side of the bump 115 is curved.

In this case, the seed layer 113 is interposed between the first pad 106 and the bump 115.

The seed layer 113 is a seed layer for forming a metallic plate (to be described later) serving as a base material used to form the bump 115.

The seed layer 113 is formed on a portion of the top surface and a lateral side of the protective layer 108, and the first pad 106.

In this case, preferably, at least two bumps 115 are formed. For example, the at least two bumps 115 may be formed on the first pads 106, which are positioned at the left and right sides of the central first pad 106, respectively.

As shown in drawings, the bumps 115 may be formed at the leftmost first pad, any one adjacent to the leftmost first pad, the rightmost first pad, and any one adjacent to the rightmost first pad, respectively.

In other words, the bump 115 is used to constitute a package together with the upper substrate. Accordingly, at least one bump 115 is formed at each of the left and right sides in order to easily constitute the package together with the upper substrate.

In this case, the height of the bump 115 is preferably formed higher than the heights of the electronic device 112 and the processor chip 110 attached to the second insulating layer 104.

Preferably, a portion of the bump 115 protruding upward of the protective layer 108 has a thickness in the range of 100 μm to 150 μm.

Meanwhile, the bump 115 substantially includes the seed layer 113.

In this case, a typical bump is formed by performing an electrolytic plating scheme with, respect to a seed layer. However, according to the embodiment, the bump 115 is formed by performing an etching scheme instead of the electrolytic plating scheme.

In this case, the etching scheme may include a wet etching scheme.

The wet etching scheme is an etching scheme performed using chemicals to corrode and melt only target metal. According to the wet etching scheme, a larger number of substrates are performed at once, and lower-price equipment or chemicals are used when comparing with those of a dry etching scheme. In addition, according to the wet etching scheme, as the etch depth is increased, corrosion occurs in a sectional direction, and the etching rate is varied depending on the temperature of the chemicals.

Therefore, according to the embodiment, the metallic plate formed on the first pad 106 is etched using the wet etching scheme, thereby forming a bump having a lateral side with a curvature, and upper and lower widths mutually different from each other.

Hereinafter, the shape of the bump 115 will be described in more detail with reference to FIG. 3.

Figure 3:
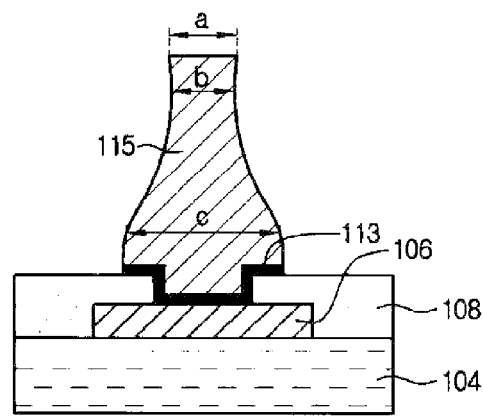
FIG. 3 is an enlarged view showing, a bump shown in FIG. 2.

Referring to FIG. 3, the bump 115 is formed on the first pad 106 exposed through the protective layer 108.

In this case, the seed layer 113 is formed on the first pad 106, and the bump 115 is formed on the seed layer 113.

Actually, the bump 115 is formed by performing the wet etching scheme with respect to the metallic plate (to be described later), which is formed on the protective layer 108, using the seed layer 113.

In this case, the bump 115 has the upper and lower widths mutually different from each other due to the isotropic etching effect of the wet etching scheme.

Further, the lateral side of the pump 115 is curved.

The upper portion of the bump 115 has a first width a, and the lower portion of the bump 115 has a second width c, and a specific portion of the bump 115 interposed between the upper and lower portions has a third width b.

In this case, the width of the bump 115 is gradually decreased from the upper portion to a point of inflection, but gradually increased from the point of the inflection to the lower portion.

Accordingly, the first width a is narrower than the second width c, and wider than the third width b.

Preferably, the bump 115 has a sectional surface formed in the shape of a trapezoid having a curved lateral side.

Since the bump 115 has the lower width narrower than the upper width as described above, the short to be caused by the bridge can be prevented even at the fine pitch of 300 μm or less. In addition, since the upper substrate can be attached using a small amount of solder, the structure more advantageous in the fine pitch can be formed.

In addition, although not shown in drawings, the solder to be formed on the bump 115 thereafter is formed to surround the lateral side of the bump 115. Accordingly, the solder has excellent bonding reliability.

The bump 115 may be formed of a metallic material such as copper (Cu) or tin (Sn).

FIGS. 4 to 19 are sectional views to explain a method of fabricating the printed circuit board shown in FIG. 2 in sequence of process steps.

Figure 4:
FIGS. 4 to 19 are sectional views to explain a method of fabricating the printed circuit board shown in FIG. 2 in sequence of process steps.

Referring to FIG. 4, the first insulating layer 101, which serves as a base when the printed circuit board 100, is fabricated is prepared.

The first insulating layer 101 is a base material used to form a circuit pattern existing in the printed circuit board 100.

The first insulating layer 101 may include a thermosetting or thermoplastic polymeric substrate, a ceramic substrate, an organic-inorganic composite material substrate, or a glass fiber impregnated substrate. If the insulating layers include the polymeric resin, the insulating layers may include epoxy insulating resin. Alternatively, the insulating layer may include polyimide based resin.

A metallic layer (not shown) is formed on at least one surface of the first insulating layer 101. The metallic layer (not shown) is used to form the internal circuit pattern 102.

The metallic layer may be formed by performing the electroless plating scheme with respect to the first insulating layer 101. Alternately, copper clad laminate (CCL) may be used.

In this case, when the metallic layer is formed through the electroless plating scheme, roughness is provided on the top surface of the first insulating layer 101, so that the metallic layer can be smoothly plated.

The metallic layer may be formed of a metallic material, such as copper (Cu), iron (Fe), and the alloy thereof, having conductivity.

Figure 5:
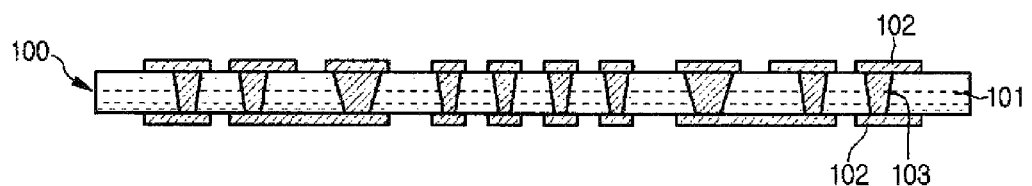

Thereafter, referring to FIG. 5, circuit patterns 102 are formed by etching the metallic layers provided on the top surface and the bottom surface of the first insulating layer 101 that is prepared. Then, a via hole (not shown) is formed in the first insulating layer 101 to form the conductive via 103 to mutually electrically connect the circuit patterns 102 formed on the top surface and the bottom surface of the first insulating layer 101.

The circuit patterns 102 may be formed by coating and patterning photoresist on top surface and bottom surface of the metallic layer, and performing exposure and developing processes with respect to the resultant structure to form photoresist patterns.

In other words, the circuit pattern 102 may be formed through typical processes, such as an additive process, a subtractive process, a modified semi-additive process (MSAP), and a semi-additive process, of fabricating the printed circuit board, and the details thereof will be omitted.

The conductive via 103 is formed to conduct at least one area of a first layer circuit pattern and a second layer circuit pattern. The via hole to form the conductive via 103 may be formed through a process such as a laser process, and the conductive via 103 may be formed by filling a metallic material in the via hole.

In this case, the metallic material may include any one selected from the group consisting of Cu, Ag, Sn, Au, Ni and Pd. The filling of the metallic material may be performed through any one of an electroless plating scheme, an electrolytic plating scheme, a screen printing scheme, a sputtering scheme, an evaporation scheme, an injecting scheme, and a dispensing scheme or the combination thereof.

In this case, the sequence of forming the circuit patterns 102 and the conductive via 103 is not important. However, in order to more efficiently process the via hole, a process of forming the conductive via 103 is first performed so that the conductive via 103 is formed, and then the circuit pattern 102 is formed.

Figure 6:
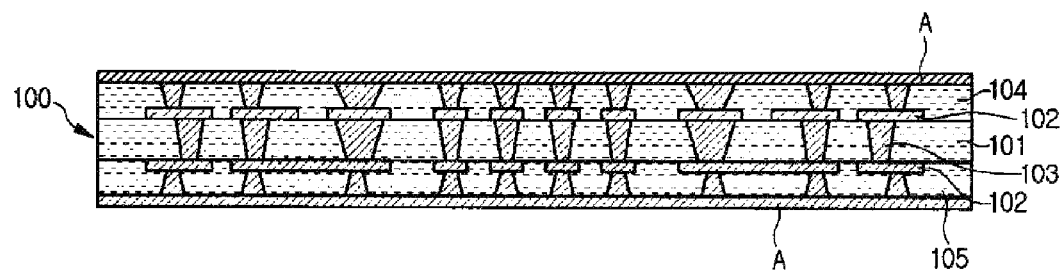

Thereafter, referring to FIG. 6, the second insulating layer 104 is formed so that the circuit pattern 102 formed on the top surface of the first insulating layer 101 is buried in the second insulating layer 104.

In this case, although the second insulating layer 104 may have one layer structure, the second insulating layer 104 may have a structure in which a plurality of layers are formed and laminated thereon. In addition, the second insulating layer 104 may include a plurality of layers formed of the same material including epoxy, phenolic resin, prepreg, a polyimide film, or an ABF film.

A metallic layer A may be formed on one surface of the second insulating layer 104.

The metallic layer A may be provided to form the first pad 106 or the external circuit pattern (not shown) thereafter.

The metallic layer A performs a function of allowing resin to easily flow or spread when a press process is performed by using heat or pressure.

The third insulating layer 105 is formed so that the circuit pattern 102 formed on the bottom surface of the first insulating layer 101 is buried in the third insulating layer 105.

In this case, although the third insulating layer 105 may have one layer structure, the third insulating layer 104 may have a structure in which a plurality of layers are formed and laminated thereon. In addition, the third insulating layer 105 may include a plurality of layers formed of the same material including epoxy, phenolic resin, prepreg, a polyimide film, or an ABF film.

The metallic layer A may be formed on one surface of the third insulating layer 105.

The metallic layer A may be provided to form the second pad 107 or the external circuit pattern (not shown) thereafter.

The metallic layer A performs a function of allowing resin to easily flow or spread when a press process is performed by using heat or pressure.

Figure 7:
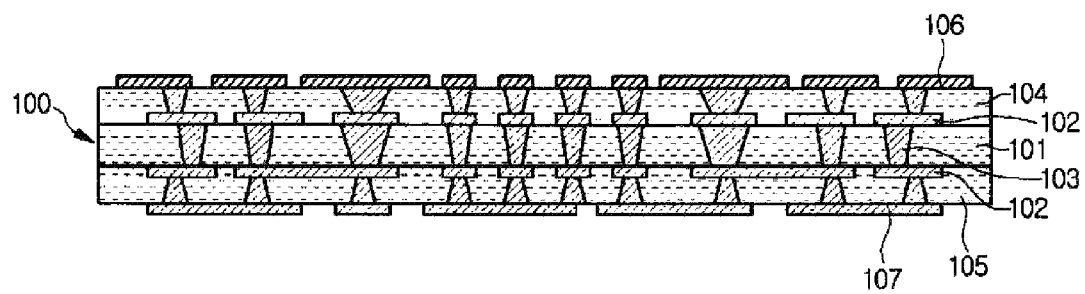

Next, referring to FIG. 7, the first pad 106 is formed by etching the metallic layer formed on the top surface of the second insulating layer 104, and the via hole (not shown) is formed in the second insulating layer 104, thereby forming a conductive via to electrically connect the circuit pattern 102 formed on the top surface of the first insulating layer 101 with the first pad 106.

In other words, the first pad 106 may be formed through typical processes, such as an additive process, a subtractive process, a modified semi-additive process (MSAP), and a semi-additive process, of fabricating the printed circuit board, and the details thereof will be omitted.

In addition, the second pad 107 is formed by etching the metallic layer formed on the bottom surface of the third insulating layer 105, and the via hole (not shown) is formed in the third insulating layer 105, thereby forming a conductive via to electrically connect the circuit pattern 102 formed on the bottom surface of the first insulating layer 101 with the second pad 107.

Figure 8:
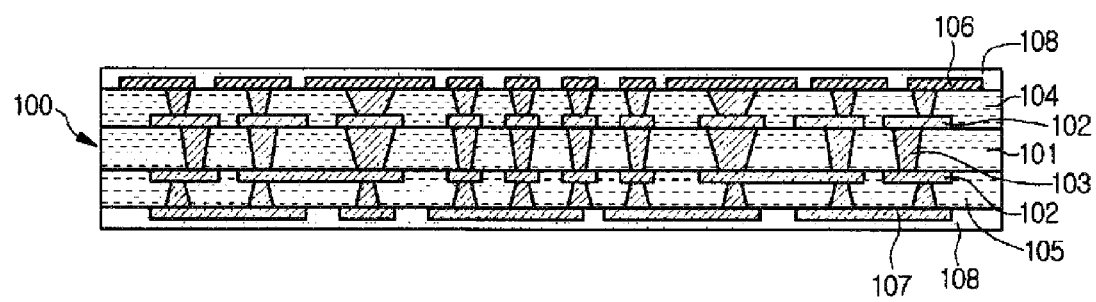

Thereafter, referring to FIG. 8, the protective layers 108 are formed on the top surface of the second insulating layer 104 and the bottom surface of the third insulating layer 105.

The protective layers 108 are formed to protect the surface of the second insulating layer 104, the surface of the first pad 106, the surface of the third insulating layer 105, and the surface of the second pad 107. The protective layer 108 may include at least one layer formed using at least one of solder resist, an oxide, and gold (Au).

Figure 9:
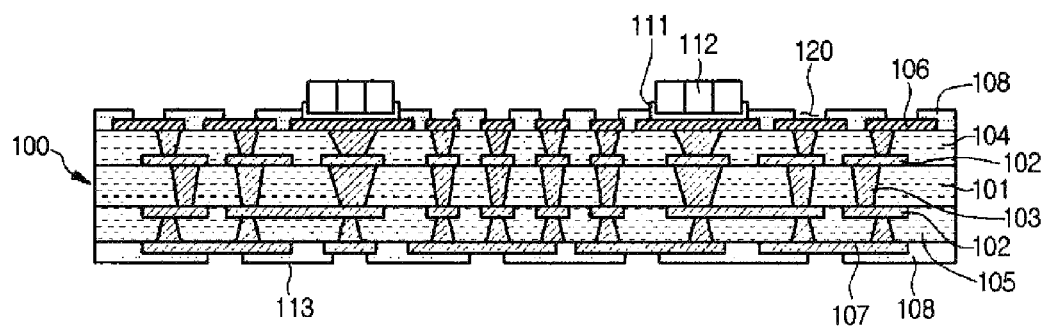

Next, referring to FIG. 9, the protective layers 108 are processed to expose the surfaces of the first pad 106 and the surface of the second pad 107 to the outside.

In other words, the protective layers 108 are formed to include the openings 120 to expose portions of the top surfaces of the first and second pads 106 and 107, and the openings 120 have a diameter smaller than those of the first and second pads 106 and 107.

Accordingly, the edges of the first and second pads 106 and 107 are protected by the protective layers 108.

Thereafter, the bonding paste 111 is applied to at least one of the first pads exposed through the openings 120 of the protective layer 108, and the electronic device 112 is mounted on the bonding paste 111.

The electronic device 112 may be a passive device. For example, the electronic device 112 may be a resistor, an inductor, or a capacitor. Preferably, the electronic device 112 may be a multiple layer ceramic capacitor (MLCC).

The bonding paste 111 may include at least one solder cream selected from the group consisting of a low-melting-point solder, a high-melting-point solder, a solder including alloy particles, a resin-containing solder, and the combination thereof, or a metal material having an adhesive property. If necessary, the bonding paste 111 may include metallic powders to ensure electric conductivity.

As the bonding paste 111 is applied on the at least one of the remaining first pads 106, the electronic device 112 is securely mounted on the bonding paste 111, so that the bonding paste 111 is deposited in a lateral side direction of the electronic device 112.

Figure 10:
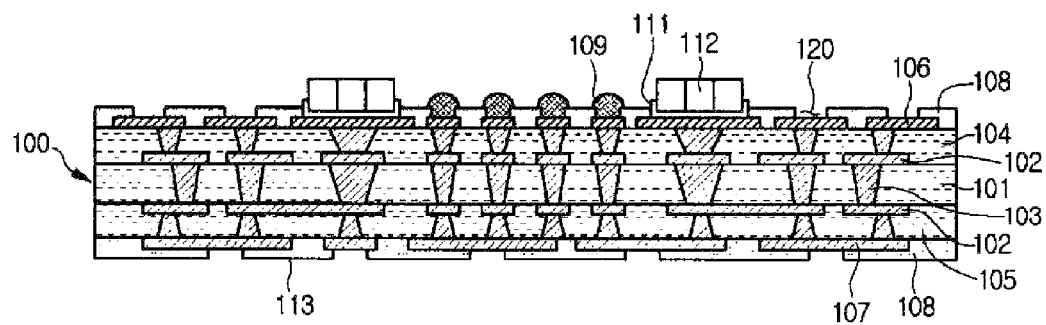

Next, referring to FIG. 10, the first solder ball 109 is formed on at least one of the first pads 106 exposed through the opening 120 of the protective layer 108.

Figure 11:
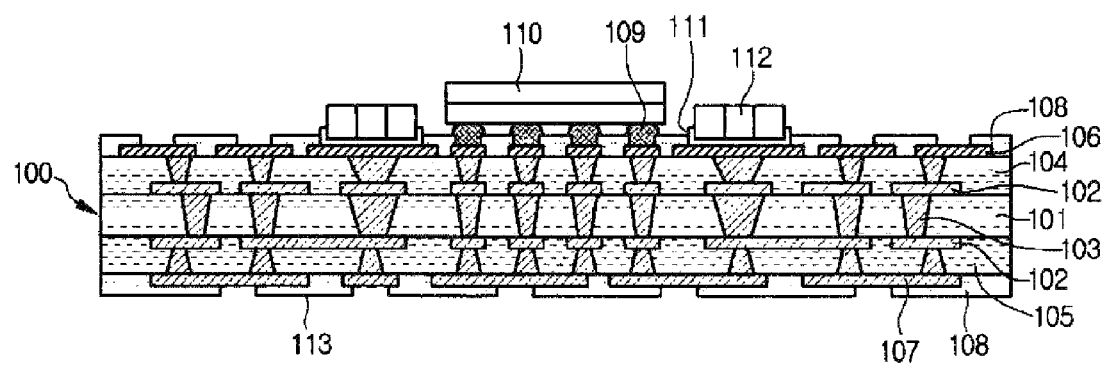

Thereafter, referring to FIG. 11, the processor chip 110 is attached to the first solder ball 109.

The processor chip 110 is electrically connected with the first pad 106 by the first solder ball 109.

Figure 12:
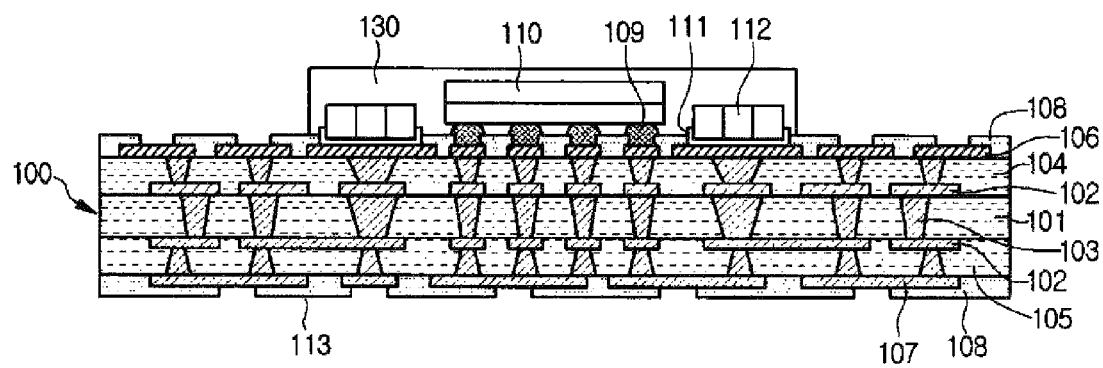

Next, referring to FIG. 12, a cover layer 130 is formed to cover both of the electronic device 112 and the processor chip 110 while opening a portion of the top surface of the first pad 106.

Figure 13:
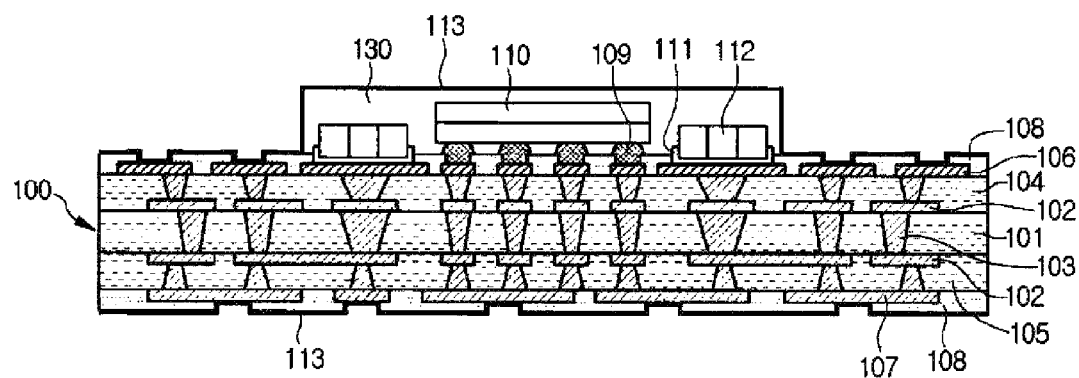

Thereafter, referring to FIG. 13, if the cover layer 130 is formed, the seed layer 113 is formed on the surfaces of the protective layer 108, the first pad 106, the second pad 107, and the cover layer 130. The seed layer 113 preferably has the thickness of 1 μm.

The seed layer 113 may be formed through the electroless plating scheme.

The electroless plating scheme may be performed in the sequence of a degreasing process, a soft etching process, a pre-catalyst process, a catalyst treatment process, an accelerator process, an electroless plating process, and an anti-oxidation treatment process. In addition, the seed layer may be formed by sputtering metallic particles using plasma instead of the plating scheme.

In addition, the seed layer 113 may be formed of metal including pure nickel (Ni). Alternatively, the seed layer 113 may be formed of the alloy of Ni and heterogeneous metal.

Figure 14:
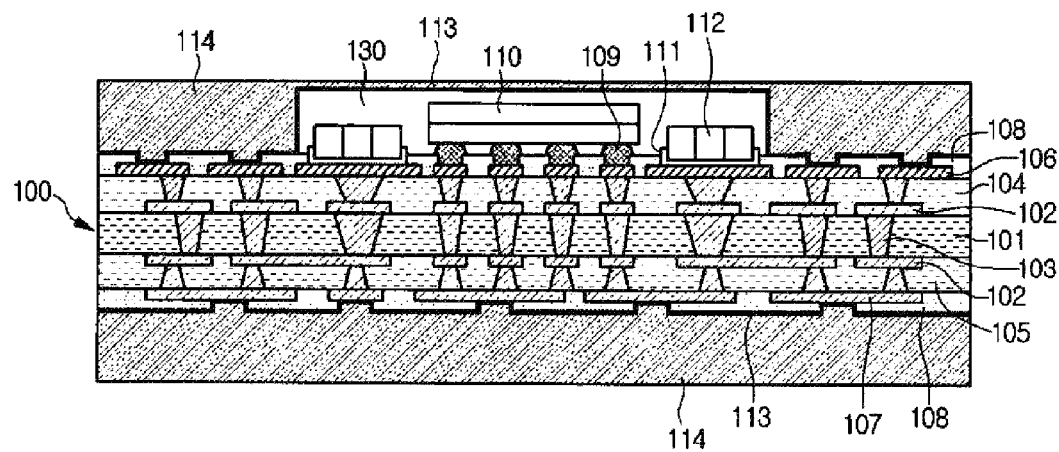

Thereafter, referring to FIG. 14, the metallic plate 114 is formed by performing the electrolytic plating scheme based on the seed layer 113.

The metallic plate 114 is formed throughout the entire portion of an area in which the seed layer 113 is formed.

Figure 15:
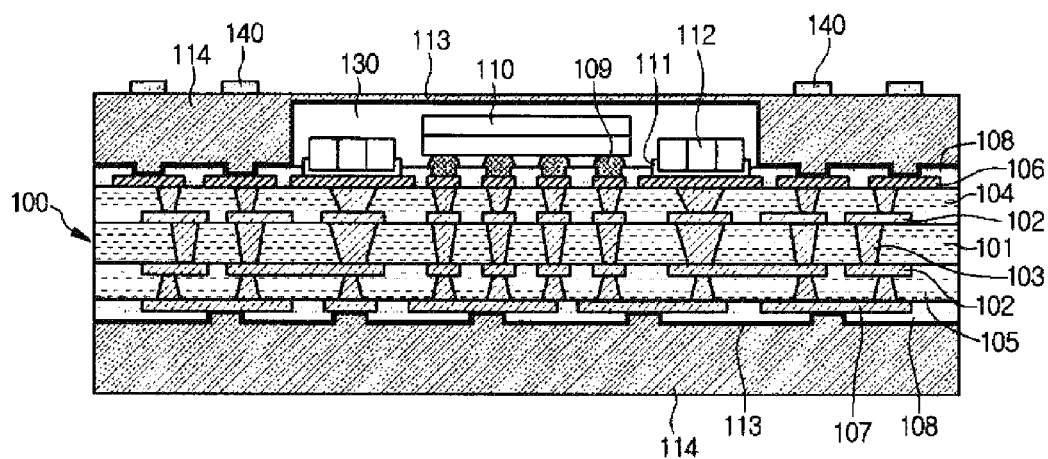

Next, referring to FIG. 15, a mask 140 is attached to the surface of the metallic plate 114, which is positioned corresponding to an area in which the bump is formed.

Figure 16:
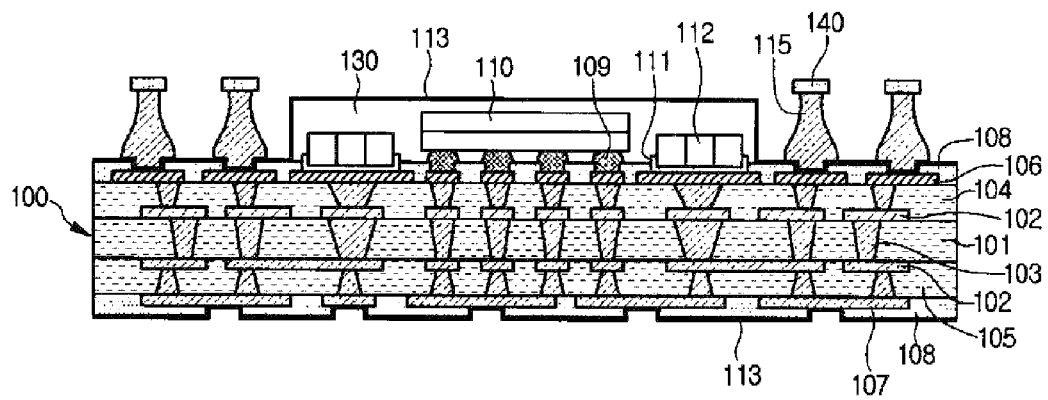

Thereafter, referring to FIG. 16, the metallic plate 114 is wet-etched. In this case, if the metallic plate 114 is wet etched, the metallic plate 114 is removed from the remaining area except for an area (an area for a bump) to which the mask 140 is attached.

In this case, the bump 115 is formed in the shape of a trapezoid having a lower upper width and a wider lower width due to the isotropic etching based on the wet etching scheme at a portion of the metallic plate 114, on which the mask 140 is formed.

Further, the bump 115 has a curved lateral side.

Meanwhile, the seed layer 113 is not etched by, an etchant used to etch the metallic plate 114, but the shape of the seed layer 113 is originally maintained.

In other words, the bump 115 is used to constitute a package together with the upper substrate. Accordingly, at least one bump 115 is formed at each of the left and right sides in order to efficiently support both end portions of the upper substrate.

In this case, the height of the bump 115 is preferably formed higher than the heights of the electronic device 112 and the processor chip 110 attached to the second insulating layer 104.

Preferably, a portion of the bump 115 protruding upward of the protective layer 108 has a thickness in the range of 100 μm to 150 μm.

Figure 17:
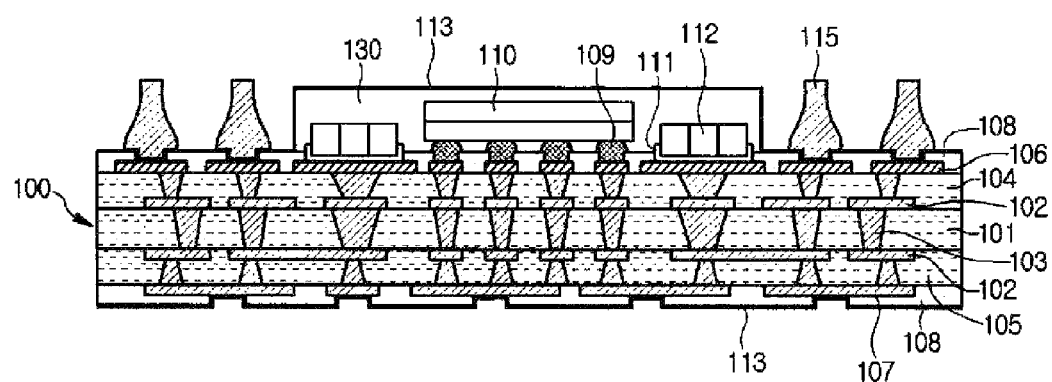

Thereafter, referring to FIG. 17, the mask 140 attached to the top surface of the bump 115 is removed from the bump 115.

Figure 18:
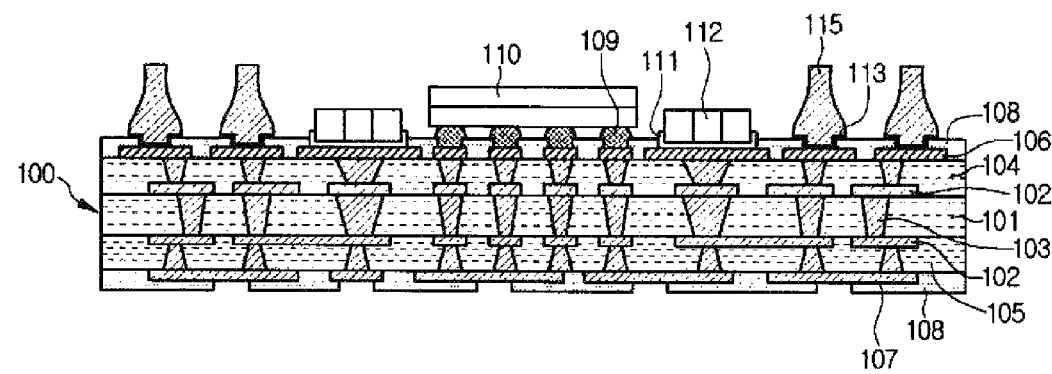

Subsequently, referring to FIG. 18, the seed layer 113 previously formed to form the metallic plate 114 is removed.

In this case, if an etching process is performed using an etchant used to etch the seed layer 113, the bump 115 and the second pad 107 are not etched, but the shapes of the bump 115 and the second pad 107 are originally maintained.

Figure 19:
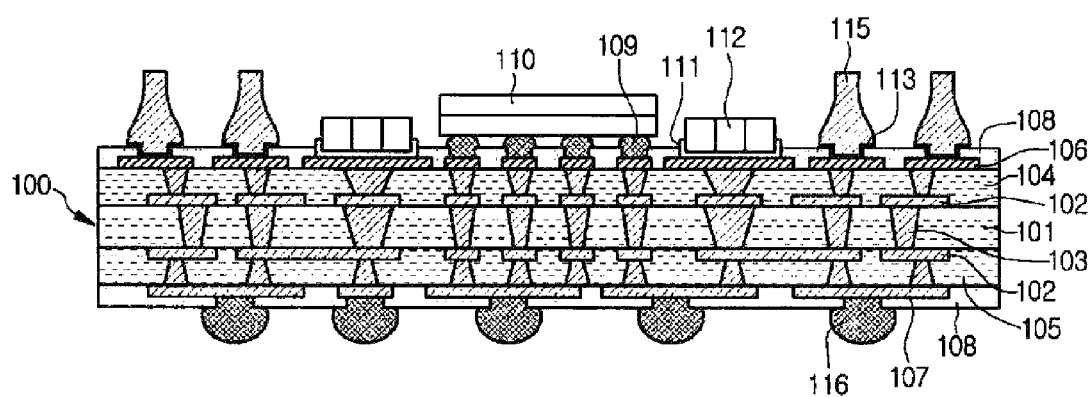

Accordingly, the seed layer 112 positioned under the bump 115 is not removed, but remains Subsequently, referring to FIG. 19, the second solder ball 116 is formed on at least one of the second pads 107.

According to the embodiment, a metal post is formed on the lower substrate, and the upper substrate is attached to the lower substrate using the metal post, thereby fabricating the package substrate, so that the fine pith can be formed. Accordingly, the productivity of a manufacturer can be maximized.

In addition, according to the embodiment, the electronic device exposed to the outside is attached on the lower substrate and the attachment space of the electronic device is molded using resin in the package process performed together with the upper substrate. Accordingly, the degree of freedom can be enhanced in the design of the substrate for the attachment of the electronic device, and the productivity can be improved in terms of product yield.

In addition, according to the embodiment, since the molding area formed between the lower substrate and the upper substrate is supported by the metal post formed on the lower substrate, the electronic device attached to the molding area can be efficiently protected, so that the reliability of the package substrate can be improved.

Further, according to another embodiment, the lateral side of the metal post is curved and the metal post has the shape of a trapezoid having the upper width narrower than the lower width, so that the distance between adjacent metal posts is increased to prevent the short failure. In addition, the upper substrate can be attached to the lower substrate using a small amount of solder.

In addition, according to the embodiment, since the metal post is formed through an etch scheme instead of a pattern plating scheme, the fabrication cost of the printed circuit board can be reduced.

Figure 20:
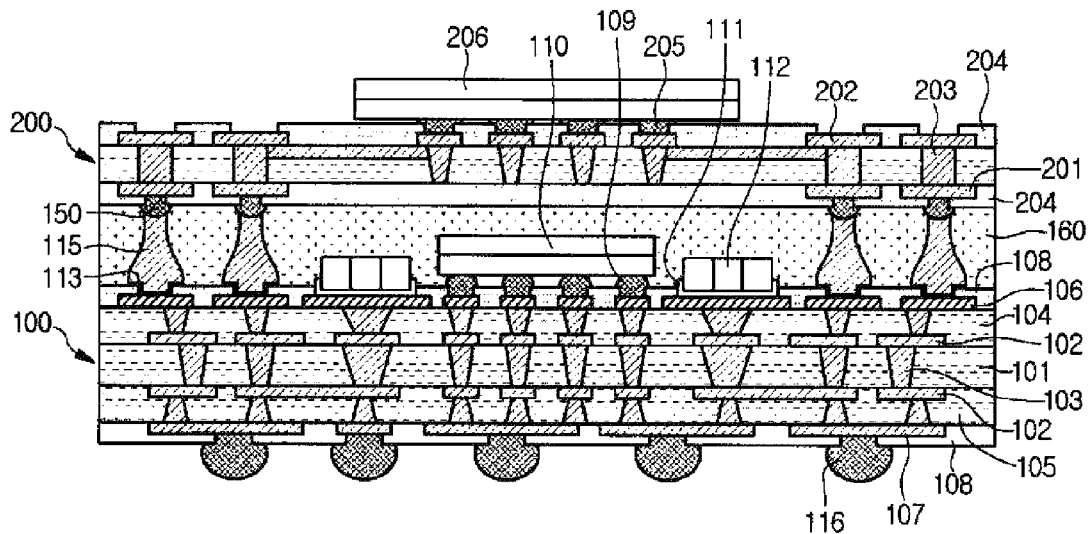
FIG. 20 is a sectional view to explain a package substrate according to the embodiment.

FIG. 20 is a sectional view to explain a package substrate according to the embodiment.

Referring to FIG. 20, the package substrate includes a lower substrate 100 and an upper substrate 200.

Since the lower substrate 100 has been described above with reference to FIG. 2, the details thereof will be omitted.

The upper substrate 200 includes a fourth insulating layer 201, a circuit pattern or pad 202, a conductive via 203, a solder ball 205, and a memory chip 206.

Although the fourth insulating layer 201 may be a support substrate of the printed circuit board in which a single circuit pattern is formed, the fourth insulating layer 201 may refer to an insulating layer area in which any one circuit pattern is formed in a printed circuit board substrate having a plurality of lamination structures.

The fourth insulating layer 201 is provided in the form of an insulating plate, and may include a thermosetting or thermoplastic polymeric substrate, a ceramic substrate, an organic-inorganic composite material substrate, or a glass fiber impregnated substrate. If the insulating layers include the polymeric resin, the insulating layers may include epoxy insulating resin such as FR-4, bismaleimide triazine (BT), or ajinomoto build up film (ABF). Alternatively, the insulating layer may include polyimide based resin, but the embodiment is not limited thereto.

The circuit pattern or pad 202 is formed on at least one surface of the fourth insulating layer 201.

In other words, the circuit pattern or pad 202 may be formed through typical processes, such as an additive process, a subtractive process, a modified semi-additive process (MSAP), and a semi-additive process, of fabricating the printed circuit board, and the details thereof will be omitted.

The conductive via 203 is formed in the fourth insulating layer 201.

The conductive via 203 electrically connects the circuit pattern or pad 202 formed on the top surface of the fourth insulating layer 201 with the circuit pattern or pad 202 formed on the bottom surface of the fourth insulating layer 201.

The conductive via 203 may include any one selected from the group consisting of Ag, Sn, Au, Ni, and Pd, and the filling of the metallic material may be performed through any one of an electroless plating scheme, an electrolytic plating scheme, a screen printing scheme, a sputtering scheme, an evaporation scheme, an injecting scheme, and a dispensing scheme or the combination thereof.

The solder ball 205 is formed on at least one of the circuit pattern or pads 202 formed on the top surface of the fourth insulating layer 201.

The memory chip 206 is mounted on the solder ball 205.

Since the formation of the solder ball 205 and the mounting of the memory chip 206 are generally known, the details thereof will be omitted in the embodiment.

The upper substrate 200 is mutually coupled to the lower substrate 100 by a connection solder ball 150.

In other words, the connection solder ball 150 is formed on the bump 115 of the lower substrate 100.

In this case, since bumps 115 are formed at both ends of the lower substrate 100, connection solder balls 150 are formed on the bumps 115, which are formed at left and right areas of the lower substrates 100, when viewed in the sectional view of the lower substrate 100.

The upper substrate 200 is attached onto the connection solder ball 150 formed on the bump 115. In this case, the upper substrate 200 is supported by the bump 115, and attached to onto the connection solder ball 115 through an adhesive property provided by the connection solder ball 150.

A molding layer 160 is interposed between the lower substrate 100 and the upper substrate 200.

The molding layer 160 protects the surfaces of the lower and upper substrates 100 and 200 while protecting parts formed on the lower substrate 100.

In other words, the electronic device 112 and the processor chip 110 are attached to the lower substrate 100. In this case, to enhance the manufacturability of the lower substrate 100 while improving the degree of freedom in design, the electronic device 112 and the processor chip 110 are formed on the upper portion of the lower substrate 100 in the state that the electronic device 112 and the processor chip 110 are exposed to the outside.

In addition, the upper substrate 200 is attached to the lower substrate 100, and the upper substrate 200 is securely mounted on the bump 115 formed on the lower substrate 100.

In this case, since the height of the bump 115 is higher than the heights of the electronic device 112 and the processor chip 110, the electronic device 112 and the processor chip 110 are exposed to the outside in the state that the upper substrate 200 is attached to the lower substrate 100.

Accordingly, the molding layer 160 is formed between the lower and upper substrates 100 and 200, so that the molding layer 160 is filled in a space between the lower and upper substrates 100 and 200 formed by the metal bump 115.

The molding layer 160 may be formed of resin.

Therefore, the bottom surface of the upper substrate 200, a protective layer 204 formed under the upper substrate 200, the surface of the lower substrate 100, the protective layer 108 formed on the lower substrate 100, the bump 115 formed on the lower substrate 100, and the electronic device 112 and the processor chip 110 formed on the lower substrate 100 are buried in the molding layer 160.

Figure 21:
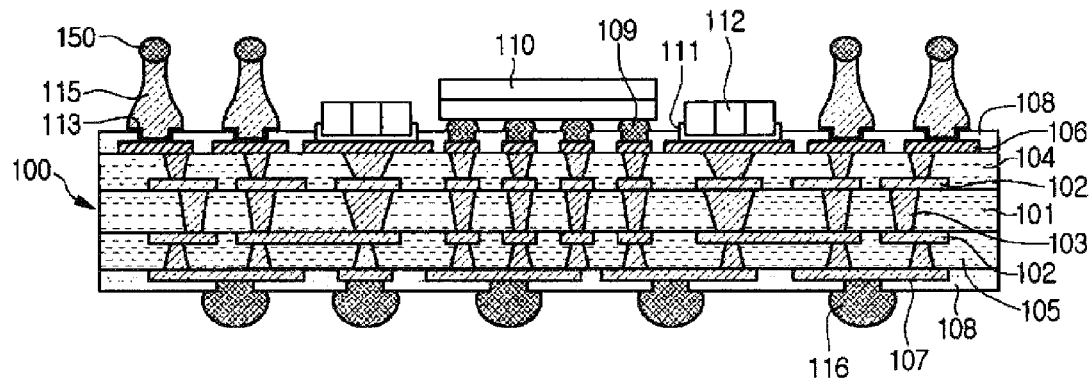
FIGS. 21 to 23 are sectional views to explain a method of fabricating the package system shown in FIG. 20 in sequence of process steps.
Figure 22:
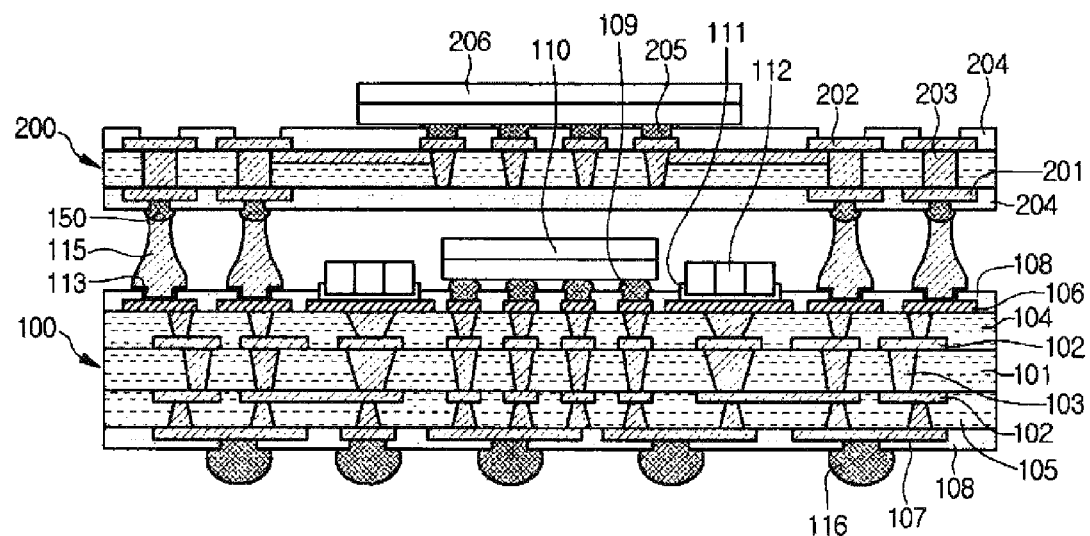
Figure 23:
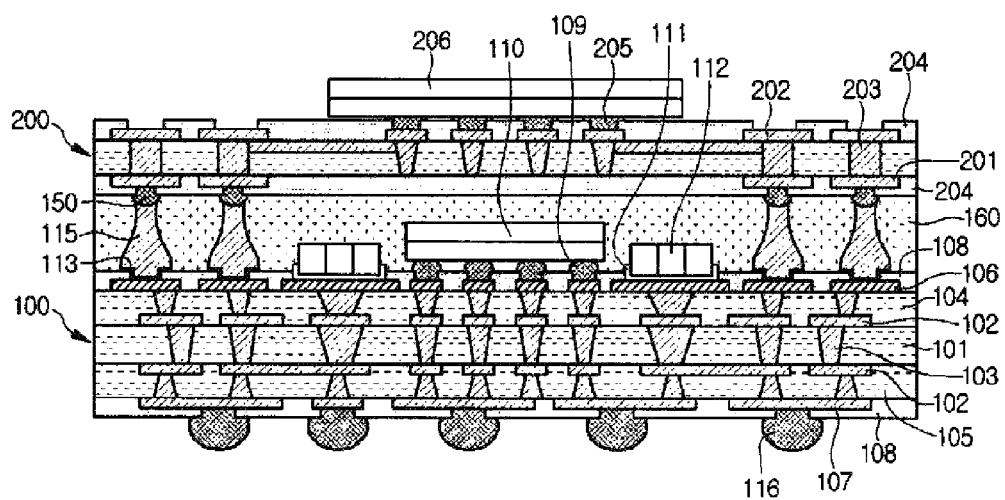

FIGS. 21 to 23 are sectional views to explain a method of fabricating the package system shown in FIG. 20 in sequence of process steps.

Referring to FIG. 21, the lower substrate 100 is first fabricated as described above.

After the lower substrate 100 has been fabricated, the connection solder ball 150 is formed on the bump 115 formed on the lower substrate 100.

Next, referring to FIG. 22, the upper substrate 100 is securely mounted on the solder ball 150, and a reflow process is performed with respect to the resultant structure, so that the upper substrate 200 is attached to the lower substrate 100.

In this case, the upper substrate 200 is securely mounted on the lower substrate 100 in the state that the upper substrate 200 is mounted on the bump 115.

Subsequently, referring to FIG. 23, the space between the lower and upper substrates 100 and 200 is filled with resin to form the molding layer 160.

Therefore, the bottom surface of the upper substrate 200, a protective layer 204 formed under the upper substrate 200, the surface of the lower substrate 100, the protective layer 108 formed on the lower substrate 100, the bump 115 formed on the lower substrate 100, and the electronic device 112 and the processor chip 110 formed on the lower substrate 100 are buried in the molding layer 160.

According to the embodiment, a metal post is formed on the lower substrate, and the upper substrate is attached to the lower substrate using the metal post, thereby fabricating the package substrate so that the fine pith can be formed. Accordingly, the productivity of a manufacturer can be maximized.

In addition, according to the embodiment, the electronic device exposed to the outside is attached on the lower substrate and the attachment space of the electronic device is molded using resin in the package process performed together with the upper substrate. Accordingly, the degree of freedom can be enhanced in the design of the substrate for the attachment of the electronic device, and the productivity can be improved in terms of product yield.

In addition, according to the embodiment, since the molding area formed between the lower substrate and the upper substrate is supported by the metal post formed on the lower substrate, the electronic device attached to the molding area can be efficiently protected, so that the reliability of the package substrate can be improved.

Further, according to the embodiment, the lateral side of the metal post is curved and the metal post has the shape of a trapezoid having the upper width narrower than the lower width, so that the distance between adjacent metal posts is increased to prevent the short failure. In addition, the upper substrate can be attached to the lower substrate using a small amount of solder.

In addition, according to the embodiment, since the metal post is formed through an etch scheme instead of a pattern plating scheme, the fabrication cost of the printed circuit board can be reduced.

As described above, although the embodiment has been described in detail, the scope of the disclosure is not limited thereto. In other words, it should be understood that various modifications are possible based on the inventive concept defined by attached claims within the scope of the disclosure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A printed circuit board comprising:
an insulating substrate;
a plurality of pads on a top surface of the insulating substrate;
a protective layer formed on the insulating substrate and having an opening to expose a top surface of the pads;
a bump formed on at least one of the pads and protruding upward of a surface of the protective layer; and
a seed layer between the at least one of the pads and the bump,
wherein the bump comprises:
a first bump portion filled in the opening of the protective layer and directly connected with a top surface of the one of the pads; and
a second bump portion on the first bump portion and protruding upward of the surface of the protective layer,
wherein the first bump portion is integrated with the second bump portion,
wherein an entire lateral side of the second bump portion has a curvature lateral surface,
wherein a width of the second bump portion is gradually decreased from an upper portion of the second bump portion to a point of inflection and gradually increased from the point of the inflection to a lower portion of the second bump portion,
wherein a width of the upper portion of the second bump portion is narrower than a width of the lower portion of the second bump portion, and
wherein the point of the inflection is higher than a central point of the curvature lateral surface of the second bump portion.

2. The printed circuit board of claim 1, wherein the curvature lateral surface is a wet-etched lateral side surface.

3. The printed circuit board of claim 1, further comprising an electronic device attached to at least one of remaining pads by a bonding ball formed on the at least one of the remaining pads,
wherein the electronic device is formed at an upper portion of the insulating substrate and exposed to an outside.

4. The printed circuit board of claim 3, wherein the bump has a top surface higher than a top surface of the electronic device attached to the upper portion of the insulating substrate.

5. A package substrate comprising:
a lower substrate having at least one electronic device or at least one first chip attached thereto; and
an upper substrate having at least one second chip attached thereto and coupled to the lower substrate,
wherein the lower substrate comprises:
an insulating substrate;
a plurality of pads on a top surface of the insulating substrate;
a protective layer formed on the insulating substrate and having an opening to expose a top surface of the pads;
a plurality of bumps provided on the plurality of pads, protruding upward of a surface of the protective layer, and formed on a top surface thereof with a solder ball; and
a plurality of seed layers between the plurality of pads and the plurality of bumps,
wherein the upper substrate is supported by the plurality of bumps and attached to the lower substrate through the solder ball,
wherein each of the plurality of bumps comprises:
a first bump portion filled in the opening of the protective layer and directly connected with a top surface of the one of the pads; and
a second bump portion on the first bump portion and protruding upward of the surface of the protective layer,
wherein the first bump portion is integrated with the second bump portion,
wherein an entire lateral side of the second bump portion has a curvature lateral surface,
wherein a width of the second bump portion is gradually decreased from an upper portion of the second bump portion to a point of inflection and gradually increased from the point of the inflection to a lower portion of the second bump portion,
wherein a width of the upper portion of the second bump portion is narrower than a width of the lower portion of the second bump portion, and
wherein the point of the inflection is higher than a central point of the curvature lateral surface of the second bump portion.

6. The package substrate of claim 5, wherein the at least one electronic device or the at least first chip is formed at an upper area of the insulating substrate between the bumps to be exposed to an outside, and has a top surface provided lower than the top surface of the bumps.

* * * * *